US00RE37294E

(19) United States
(12) Reissued Patent
Knapp et al.

(10) Patent Number: US RE37,294 E
(45) **Date of Reissued Patent: *Jul. 24, 2001**

(54) ION BEAM PROCESS FOR DEPOSITION OF HIGHLY ABRASION-RESISTANT COATINGS

(75) Inventors: Bradley J. Knapp, Kutztown; Fred M. Kimock, Macungie, both of PA (US); Rudolph H. Petrmichl, Ann Arbor, MI (US); Norman D. Galvin, San Jose, CA (US)

(73) Assignee: Diamonex, Incorporated, Allentown, PA (US)

( * ) Notice: This patent is subject to a terminal disclaimer.

(21) Appl. No.: 09/048,016

(22) Filed: Mar. 25, 1998

Related U.S. Patent Documents

Reissue of:
(64) Patent No.: 5,508,368
Issued: Apr. 16, 1996
Appl. No.: 08/205,898
Filed: Mar. 3, 1994

(51) Int. Cl.[7] ..... B05D 3/14; C23C 14/02; C23C 14/14; C23C 14/06; C23C 14/23; H05H 1/24

(52) U.S. Cl. ..... 427/534; 427/562; 427/563; 427/577; 427/579; 427/527; 427/530; 427/523

(58) Field of Search ..... 427/524, 525, 427/527, 529, 530, 562, 563, 574, 579, 577, 534, 523

(56) References Cited

U.S. PATENT DOCUMENTS

| | | | | |
|---|---|---|---|---|
| 4,096,315 | | 6/1978 | Kubacki . | |
| 4,282,267 | * | 8/1981 | Küyel | 427/463 |
| 4,474,827 | * | 10/1984 | Ferralli | 427/527 |

(List continued on next page.)

OTHER PUBLICATIONS

Cuomo et al, ed. *Handbook of Ion Beam Processing Technology*, Chapter 4 "Hall Effect Ion Source" by Robinson et al, p. 39–57, Noyes Publications Park Ridge, N.J., (no month) 1989.*

Kaufman et al, "En–Hall Ion Source", *J. Vac. Sci. Technol.*, A5 (4), p. 2061–2064, Jul./Aug. 1987.*

Kaufman et al, *Operation of Broad–Beam Sources*, Commonwealth Scientific Corp., Alexandria, Va., p. 5–77 (excerpt), (no month) 1984.*

Okada et al, "Application of a Hall Accelerator to Diamond-like Carbon Film Coatings", Japan J. Appl. Phys., vol. 31, part 1, No. 6A. p. 1845–1854, Jun. 1992.*

G. Dearnaly, Clinical Materials, vol. 12, pp. 237–244 (1993) Diamond–like Carbon: A Potential Means of Reducing Wear in Total Joint Replacements, no month.

*Primary Examiner*—Marianne Padgett
(74) *Attorney, Agent, or Firm*—Coudert Brothers

(57) ABSTRACT

An ion beam deposition method is provided for manufacturing a coated substrate with improved abrasion resistance, and improved lifetime. According to the method, the substrate is first chemically cleaned to remove contaminants. In the second step, the substrate is inserted into a vacuum chamber, and the air in said chamber is evacuated. In the third step, the substrate surface is bombarded with energetic ions to assist in the removal of residual hydrocarbons and surface oxides, and to activate the surface. [Alter] *After* the substrate surface has been sputter-etched, a protective, abrasion-resistant coating is deposited by ion beam deposition. The ion beam-deposited coating may contain one or more layers. Once the chosen thickness of the coating has been achieved, the deposition process on the substrates is terminated, the vacuum chamber pressure is increased to atmospheric pressure, and the coated substrate products having improved abrasion-resistance are removed from the vacuum chamber. The coated products of this invention have utility as plastic sunglass lenses, ophthalmic lenses, bar codes scanner windows, and industrial wear parts that must be protected from scratches and abrasion.

34 Claims, 1 Drawing Sheet

U.S. PATENT DOCUMENTS

| | | | | |
|---|---|---|---|---|
| 4,490,229 | | 12/1984 | Mirtich et al. . | |
| 4,541,890 | * | 9/1985 | Cuomo et al. | 156/345 |
| 4,647,494 | | 3/1987 | Meyerson et al. . | |
| 4,762,730 | | 8/1988 | Enke et al. . | |
| 4,776,925 | * | 10/1988 | Fossum et al. | 427/527 |
| 4,795,656 | * | 1/1989 | Mizoguchi et al. | 427/527 |
| 4,800,100 | * | 1/1989 | Herbots et al. | 427/527 |
| 4,842,941 | | 6/1989 | Devins et al. . | |
| 4,862,032 | | 8/1989 | Kaufman et al. . | |
| 4,992,298 | * | 2/1991 | Deutchman et al. | 427/527 |
| 5,013,690 | * | 5/1991 | Hochberg et al. | 427/527 |
| 5,051,308 | | 9/1991 | Reed et al. . | |
| 5,093,152 | | 3/1992 | Bonet et al. . | |
| 5,093,153 | * | 3/1992 | Brockot et al. . | |
| 5,135,808 | | 8/1992 | Kimock et al. . | |
| 5,156,882 | | 10/1992 | Rzad et al. . | |
| 5,190,807 | | 3/1993 | Kimock et al. . | |
| 5,206,060 | | 4/1993 | Balian et al. . | |
| 5,266,398 | * | 11/1993 | Hioki et al. | 427/527 |
| 5,268,217 | | 12/1993 | Kimock et al. . | |
| 5,338,364 | * | 8/1994 | Kurihara et al. | 427/577 |
| 5,342,660 | * | 8/1994 | Cann et al. | 427/577 |
| 5,352,493 | * | 10/1994 | Dorfman et al. | 427/577 |
| 5,368,937 | * | 11/1994 | Itoh | 427/577 |
| 5,411,758 | * | 5/1995 | Simpson | 427/577 |
| 5,427,827 | * | 6/1995 | Shing et al. | 427/577 |
| 5,455,081 | * | 10/1995 | Okada et al. | 427/562 |
| 5,464,667 | * | 11/1995 | Köhler et al. | 427/577 |
| 5,482,602 | * | 1/1996 | Cooper et al. | 427/523 |
| 5,593,719 | * | 1/1997 | Deamaley et al. | 427/530 |
| 5,674,573 | * | 10/1997 | Mitani et al. | 427/577 |
| 5,679,413 | * | 10/1997 | Petrmichl et al. | 427/534 |
| 5,691,010 | * | 11/1997 | Kuramoto et al. | 427/577 |
| 5,704,976 | * | 1/1998 | Snail | 427/577 |
| 5,750,210 | * | 5/1998 | Schmidt et al. | 427/530 |
| 5,776,552 | * | 7/1998 | Tanake et al. | 427/577 |
| 5,858,477 | * | 1/1999 | Veerasamy et al. | 427/562 |
| 5,888,593 | * | 3/1999 | Petrmichl et al. | 427/577 |

* cited by examiner

ION BEAM PROCESS FOR DEPOSITION OF HIGHLY ABRASION-RESISTANT COATINGS

Matter enclosed in heavy brackets [ ] appears in the original patent but forms no part of this reissue specification; matter printed in italics indicates the additions made by reissue.

FIELD OF THE INVENTION

This invention relates generally to a process for depositing coatings which protect a substrate from wear and abrasion. More particularly, the invention relates to a process for protecting such substrates as plastic sunglass lenses, ophthalmic lenses, bar codes scanner windows, and industrial wear parts from scratches and abrasion.

BACKGROUND OF THE INVENTION

There are numerous prior art methods for coating substrates to improve their performance, e.g. lifetime, abrasion wear resistance and similar properties. For example, consider the case of plastic sunglass lenses or plastic prescription eyewear. Due to the ease of scratching plastic, abrasion-resistant coatings are deposited onto the surface of plastic lenses. These hard outer coatings increase the useful life of the lenses. To make such coatings marketable, the process for depositing these hard coatings must be inexpensive, reliable and reproducible.

Plastic lenses sold into the ophthalmic lens market are largely coated by acrylic and polysiloxane dip-coatings or spin coatings. These coatings significantly improve the abrasion resistance of the lens compared to the uncoated lens. This is particularly true for the case of polycarbonate which is very subject to abrasion. However, improved abrasion resistance of coated lenses is still a major problem in the ophthalmic lens industry. The industrial goal is to obtain plastic lenses which exhibit the same abrasion resistance as glass lenses. Current commercial plastic lenses have abrasion resistance characteristics which are poor compared to glass. Therefore, when purchasing lenses, one must choose between glass, which is very abrasion resistant but is heavier, or plastic which is lighter but much less abrasion-resistant.

Other coatings have been suggested for plastic substrates, including lenses. Most of these coatings are so-called "plasma polymers" which are largely produced by creating a plasma from siloxane precursor gases. The substrates are exposed to the plasma, but they are not biased to cause energetic ion bombardment. The performance of these plasma polymers is often only marginally better than that of the polysiloxane and acrylic spin and dip coatings, and the performance of these coatings does not approach the performance of glass. These films are often quite soft and are not useable as protective coatings except on extremely soft substrates.

Other coating processes have been suggested in which energetic ion bombardment is caused by mounting the substrates on the powered electrode in a radio frequency (RF) plasma system and exposing the parts to the plasma, thereby creating a negative bias on the substrate surface. The resultant coatings are often more abrasion resistant than the "plasma polymers". These plasma systems are not readily scaled to a throughput required for mass production nor are they easily operated in a reproducible, controlled fashion in a production environment. The RF plasma process also suffers in that the deposition process, and the properties of the resultant coating are dependent on whether the substrate to be coated is an electrical conductor or insulator. Furthermore, if the substrate is an insulator, the thickness of the substrate strongly influences the deposition process energetics and the properties of the resultant coating. This means that for production coating of insulating substrates of different size and shape, e.g. plastic lenses, it may be necessary to have different coating processes for each type of substrate. This reduces the flexibility of the process for use in production. Additionally, systems with large area electrodes are not widely available. For example, there are no readily available commercial parallel plate RF deposition systems having large electrodes, i.e. at least one meter in diameter.

The following references illustrate prior an coating processes in which plasmas are used in direct contact with the surface of the substrate:

Rzad et. al., U.S. Pat. No. 5,156,882, describe a method of preparing a transparent plastic article having an improved protective stratum thereon. The protective stratum is deposited by plasma enhanced chemical vapor deposition (PECVD).

Balian et. al., U.S. Pat. No. 5,206,060, describe a process and device for depositing thin layers on a substrate using a plasma chemical vapor deposition (PCVD) technique. The substrate must be made conductive, and is used as an electrode in the PCVD process.

Reed et. al., U.S. Pat. No. 5,051,308, describe an abrasion-resistant article and a method for producing the same. The article includes a plastic substrate and a gradational coating applied by a PECVD process.

Devins et. al., U.S. Pat. No. 4,842,941, also describe an abrasion-resistant article and a method for making the same. The article includes a polycarbonate substrate, an interfacial layer of an adherent resinous composition on the substrate, and an abrasion-resistant layer applied on top of the interfacial layer by PECVD.

Brochot et. al., U.S. Pat. 5,093,153 describe a coated object comprising a glass substrate coated with an organomineral film by a PECVD process.

*Bonet et al., U.S. Pat. No. 5,093,152, describe a plasma polymerization method for making a coating of composition* $SiC_{0\text{-}5}N_{0.3\text{-}0.8}O_{1.3\text{-}2.5}H_{0.5\text{-}1.2}$ *on plastic optical substrates, by placing the substrate in the afterglow of a plasma and injecting a silicon-containing material near the surface of the substrate.*

Kubacki, U.S. Pat. No. 4,096,315, describes a low-temperature plasma polymerization process for coating an optical plastic substrate with a single layer coating for the purpose of improving the durability of the plastic.

Enke et. al., U.S. Pat. No. 4,762,730, describe a PECVD process for producing a transparent protective coating on a plastic optical substrate surface.

All of the prior art plasma deposition methods for application of wear and abrasion-resistant coatings suffer from one or more of the following deficiencies and shortcomings:

(1) difficulty in pre-cleaning of substrates prior to deposition;

(2) adhesion of the protective, abrasion-resistant coating;

(3) permeation of the coatings by water vapor and oxygen;

(4) fabrication of coherent, dense coatings;

(5) control of coating properties during a deposition run and batch-to-batch variation of coating characteristics;

(6) coating thickness control and reproducibility of thickness;

(7) part-to-part and batch-to-batch control of coating uniformity;

(8) difficulty in coating substrates of complex geometry or configuration; and (9) production readiness and ability to scale-up the deposition process for mass production.

These shortcomings are highlighted in the following review of the two preferred prior art methods for deposition of abrasion-resistant coatings on plastic optical substrates: plasma polymerization and biased RF plasma deposition.

The first problem encountered by both methods is the difficulty in pre-cleaning the substrates prior to deposition of the adhesion layer or abrasion-resistant film. Typically substrates are pre-cleaned in an inert gas or glow discharge (plasma) prior to deposition. This pre-cleaning technique suffers from low cleaning rate, and re-contamination of the substrate by sputtered contaminants which are deposited back onto the substrate.

One of the key requirements for a protective coating on a variety of substrates, including optics, is the need to provide a barrier to moisture, oxygen, and other environmental elements. This requires formation of a coating structure with optimal atom packing density. This atom packing density is maximized by a high degree of ion bombardment during film growth, which is not easily attainable or optimized by the plasma polymerization methods of the prior art.

Regarding the control of the coating properties within a single deposition run, and from batch-to-batch, it is well known that control is difficult with the plasma deposition methods. For the case of deposition of electrically insulating coatings on electrically conductive substrates by the biased RF plasma technique, it is known that as the deposited coating thickness increases, there will be a gradual decrease of the surface bias on the growing film; see Meyerson et al., U.S. Pat. No. 4,647,494, column 6, line 67 through column 7, line 3. This decrease results in a change in the properties of the deposited coating, i.e. hardness, stress and hydrogen concentration.

Because the size and shape of the particular part to be coated, and its method of fixturing influence the plasma uniformity and plasma density around the part, it is difficult to predict and control deposition thickness uniformity across multiple parts coated within a single coating run using the plasma deposition methods of the prior art.

While the plasma deposition methods offer high deposition rates, it is difficult to reproducibly control deposition rate, deposition thickness and deposition uniformity across large areas with plasma deposition methods. Because of the interdependence of process variables such as pressure, gas flow rate, power, and substrate bias, accurate control of deposition thickness is difficult. Thus, it is very difficult to manufacture coating layers with thickness less than 0.1 micron, and with run-to-run thickness variation of less than approximately 10%. This is a significant disadvantage of the plasma deposition techniques of the prior art for the deposition of optical coatings, especially those requiring the use of multiple, thin layers of varying refractive index, such as antireflection coatings.

Finally, because of the sensitivity of the plasma deposition processes to substrate geometry, it is often impossible to coat parts of complex geometry or configuration. Examples of complex geometry include optical lenses with high corrective power which may be edged to a variety of shapes, industrial molds used to fabricate plastic parts, and other industrial machine parts, including shafts, gears, bearings, and the like. The current industrial trend is to fabricate many of these industrial machine parts from electrically insulating plastics and ceramics. These electrically insulating industrial machine parts are especially difficult to coat uniformly by the plasma deposition methods.

All of the difficulties above combine to make mass production of protective, abrasion-resistant coatings on a variety of substrates by the plasma deposition processes of the prior art very problematic indeed. Clearly, an improved method for flexible, reproducible, and high quality mass production of abrasion-resistant coatings has long been sought.

Ion beam etching and deposition of many materials is known in the prior art. For example, ion milling is commonly used in semiconductor processing. Ion beam systems typically are more controllable than RF plasma systems in that the deposition and etching process parameters, e.g. plasma potential, substrate bias, plasma current, gas flows and chamber pressures are not as strongly coupled as they are in the RF plasma process. This results in a wider process window and better control for ion beam processing, as compared to plasma processing. Additionally, ion beam deposition equipment is available which is capable of processing in excess of 1000 square inches of substrate material per batch. It is believed that RF equipment is not commercially available which approaches this level of scale. The combination of the higher degree of control for ion beam processing and the ability to scale to large areas allows for a process which is more easily moved into production and is more robust. However, one major disadvantage to prior art ion beam deposition processes, e.g. for deposition of DLC films, is their relatively low deposition rate which leads to long production times for thick coatings, and hence high production cost.

In an article published in Clinical Materials, Vol. 12, pages 237–244 (1993), G. Dearnaley describes a process in which low vapor pressure materials are condensed on the surface of the article to be coated and simultaneously bombarded by a high energy nitrogen ion beam. In this case, the ion energy required is greater than 10 kV. These large voltages are difficult to control and become problematic in a production environment. In addition, the coatings manufactured by this method are opaque and not useable for applications where a transparent coated product is required.

Kimock, et al., U.S. Pat. Nos. 5,135,808, 5,190,807, 5,268,217 disclose direct ion beam deposition processes using a hydrocarbon gas or carbon vapor for producing abrasion wear resistant products comprising substrates with hard outer coatings of substantially optically transparent diamond-like carbon (DLC) useful for commercial articles such as optical lenses, sunglass lenses, and bar code scanner windows.

SUMMARY OF THE INVENTION

The invention provides an improved method for deposition of an abrasion-resistant coating onto substrates. More particularly, this invention provides an ion beam deposited coating to the surface of a substrate which is highly adherent, and exhibits greatly improved wear resistance and environmental durability. Still more particularly, this invention provides a low cost and efficient process for mass-producing coated substrates with improved wear resistance and superior lifetime. The method is especially useful for applying an abrasion-resistant coating to the surface of plastic optical substrates, such as lenses.

In the method of the present invention, the substrate is first chemically cleaned to remove unwanted materials and other contaminants. In the second step, the substrate is inserted into a vacuum chamber, the air in said chamber is evacuated and the substrate surface is sputter-etched by a beam of energetic ions to assist in the removal of residual contaminants such as residual hydrocarbons and surface oxides, and to activate the surface. After the substrate surface has been sputter-etched, a protective, abrasion-resistant coating is deposited using selected precursor gases by ion beam deposition. The ion beam-deposited coating may contain one or more layers. Once the chosen thickness of the coating has been achieved, the deposition process on the substrates is terminated, the vacuum chamber pressure is increased to atmospheric pressure, and the coated substrates having improved abrasion-resistance are removed from the vacuum chamber.

The present invention provides amorphous, conformal, protective, abrasion-resistant coatings containing a combination of the elements selected from the group consisting of C, Si, H, O and N. More particularly, the coatings of the present invention are selected from at least one of the following combinations of elements: Si and C; Si, C and H; Si and N; Si, N and H; Si and O; Si, O and H; Si, O and N; Si, O, N and H; Si, C and N; Si, C, H and N; Si, C and O; Si, C, H and O; Si, C, O and N; and Si, C, H, O and N.

The process for deposition of these coatings uses an ion beam source which operates with precursor gases comprising at least one of the following combinations of elements selected from the group consisting of Si and C; Si, C and H; Si and N; Si, N and H; Si and O; Si, O and H; Si, O and N; Si, C, H and O; Si, C, O and N; and Si, C, H, O and N. The process of the present invention is particularly well-suited to the manufacture of optically transparent coatings with tailored hardness, stress, and chemistry. These properties make the coatings of the present invention ideally suited to plastic substrates, such as sunglass and ophthalmic lenses. Coatings which exhibit glass-like or quartz-like properties can be made by the present process. Coatings which have properties resembling silicon carbide, silicon nitride, and hydrogenated and oxygenated forms of these materials can also be made by this process.

Additionally, diamond-like carbon coatings can be made by the process of the present invention. The term "diamond-like carbon" is meant to include amorphous materials composed of carbon and hydrogen, whose properties resemble, but do not duplicate, those of diamond. Some of these properties are high hardness (HV=about 1,000 to about 5,000 kg/mm$^2$), low friction coefficient (approximately 0.1), transparency across the majority of the electromagnetic spectrum, and chemical inertness. At least some of the carbon atoms in DLC are bonded in chemical structures similar to that of diamond, but without long range crystal order. These DLC materials can contain to 50 atomic percent of hydrogen. The DLC coatings made by the present invention are hard, inert and slippery, and are ideal for use in optical as well as many non-optical applications.

BRIEF DESCRIPTION OF THE DRAWING

Further features and advantages will become apparent from the following and more particular description of the preferred embodiment of the invention, as illustrated in the accompanying drawing in which.

DETAILED DESCRIPTION OF THE INVENTION

Figure 1:
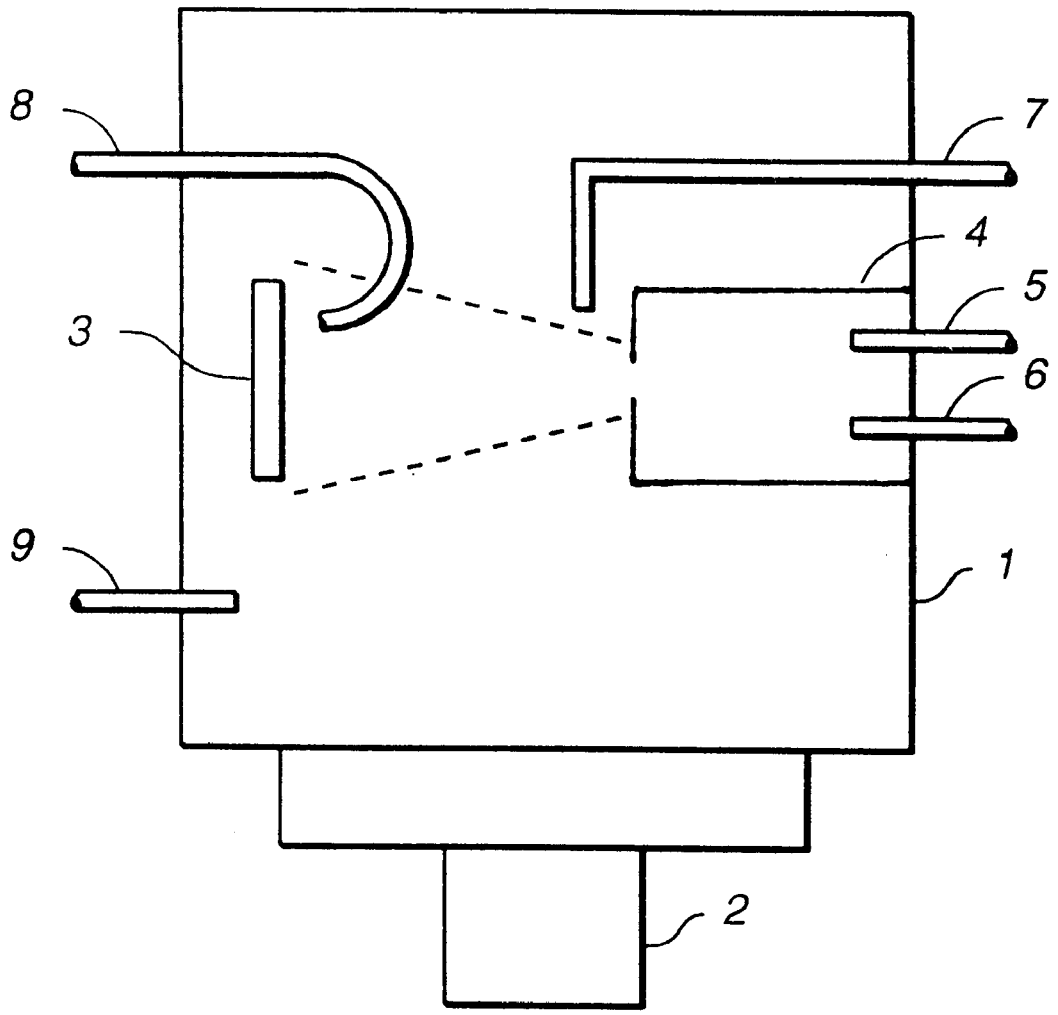
FIG. 1 is a diagrammatic view of an illustrative ion beam deposition apparatus used to manufacture coated substrate products in accordance with the present invention.

The method of the present invention substantially reduces or eliminates the disadvantages and shortcomings associated with the prior art techniques by providing:

(1) for the deposition of highly abrasion-resistant coatings on a variety of substrates, including metals, ceramics, glasses, and plastics;

(2) for the deposition of highly optically transparent, highly abrasion-resistant coatings on optically transparent plastic substrates such as lenses;

(3) for the deposition of highly abrasion-resistant coatings which are independent of the electrical conductivity and thickness of the substrate;

(4) for the deposition of a protective abrasion-resistant coating onto the surface of a substrate, in which the layer thickness and uniformity of the coating are reproducibly controlled to a high degree of accuracy;

(5) for the application of an abrasion-resistant coating which is highly repeatable and reliable;

(6) a process which is readily scaleable to large areas and has high throughput for mass production;

(7) a process in which the substrate is not limited to any particular material or geometry; and (8) for the protection of a substrate from abrasion, wear and corrosion damage during normal, or severe use conditions, and for significantly extending the lifetime of the substrate.

It has been unexpectedly found that the ion beam deposition process for the manufacture of the coatings of the present invention produced remarkable performance on a variety of substrates, especially soft optical plastics. The remarkable performance compared to prior art techniques is the result of the combination of the critical features and attributes listed below. The method of the present invention is capable of:

(1) Overcoming the difficulties in obtaining an atomically clean surface by sputter-etching the substrates using an ion beam of controlled shape, current, and energy. The ion beam "shape" is controlled by focusing the beam with electrostatic or magnetic fields. In this way, the beam can be efficiently delivered to the substrates to be processed, with maximum utilization. It has been found that the control of ion beam current and beam energy to within 1% is consistently achieved which results in a highly repeatable and predictable rate of removal of surface contaminant layers. In addition, the ion beam sputter-etching process is conducted in high vacuum conditions, such that oxidation or contamination of the surface with residual gases in the coating system is negligible. Finally, the apparatus geometry can be easily configured such that the sputtered contaminants deposit on the vacuum chamber walls, and they do not re-deposit onto the surface of the part as it is being sputter-etched.

(2) Producing excellent adhesion of the protective ion beam deposited layer(s) by generating an atomically clean surface prior to the deposition of the coating. For most applications, the deposited protective layer contains silicon. For applications in which the topmost layer of the coating does not contain silicon, adhesion can be enhanced via the use of silicon-containing adhesion-promoting interlayers between the top coating, e.g. DLC, and the substrate. In either case, the ion beam deposited layer is preferably deposited immediately upon completion of the ion beam sputter-etching step to achieve maximum adhesion to the substrate. Deposition of the coating layer(s) immediately upon completion of the ion beam sputter-etching step minimizes the possibility for re-contamination of the sputter-etched surface with vacuum chamber residual gases or other contaminants. The silicon-containing layers include a variety of amorphous materials, such as silicon oxide, silicon nitride, silicon oxy-nitride, silicon carbide, silicon oxy-carbide, silicon carbonitride, the so-called silicon-doped DLC, mixtures thereof and chemical combinations thereof. Each of the silicon-containing interlayers may contain hydrogen.

(3) Controlling and minimizing excessive compressive stress in the coatings deposited by the method of the present invention allows for the deposition of highly adherent coatings.

(4) Producing highly dense ion beam protective coatings. This makes the coatings excellent barriers to water vapor and oxygen. The high density of the ion beam deposited coatings presumably results from the extremely high degree of ion bombardment during film growth, compared to prior art methods.

(5) Producing a coating in which its properties do not change with layer thickness as is found for the prior art RF plasma deposition processes. This attribute is achieved because the coating deposition step is conducted with a charge neutralized ion beam. The charge neutrality of the ion beam deposition process also allows for coating of parts with complex geometry without interference to the process. Parts of varying geometry can be coated within a single coating run with no adverse effect on the deposition conditions. For example, lenses of various sizes and shapes can easily be coated with the same coating material in the same run. The ease of fixturing substrates for coating is one of the highly important technical advantages and distinguishing features of the present invention.

(6) Coating all portions of substrates, which contain electrically conducting and electrically insulating materials, with the same high-quality coating. In the case of the plasma deposition methods, DLC coatings of different properties may be deposited on different locations of the same substrate, depending upon whether the area being coated is an electrical conductor or an electrical insulator, and upon the electrical connections between the substrates and the vacuum chamber. Substrate conductivity has no effect on the properties of the ion beam deposited coating of the present invention, which is in sharp contrast to that of plasma deposition methods of the prior art.

(7) Obtaining minimal batch-to-batch variation in the properties of the coatings. This is the case because process parameters such as ion energy, ion current density, gas flow rate, and deposition chamber pressure are largely decoupled in the ion beam deposition method of the present invention, and because each of these process parameters can be accurately controlled and reproduced to a high degree of certainty, often to within 1%. In addition, the process endpoint coating thickness is easily defined and reproduced.

(8) Producing part-to-part thickness uniformity, e.g. a variation of less than 2% can be easily achieved. This is the case because of the compatibility of the method of the present invention with commercially available substrate holders incorporating motion, i.e. rotation and/or planetary motion.

(9) Being readily scaled-up to accommodate mass production because large scale ion beam sources are commercially available. For example, commercially available 38 cm ion beam sources have been used to deposit DLC coatings simultaneously over tour 18-inch diameter platens with a thickness variation across all parts of less than +/−2%. Similar ion beam sources can be used to practice the process of the present invention. Plasma deposition systems for application of abrasion-resistant coatings are not presently commercially available on this scale.

The apparatus for carrying out the preferred embodiment of the present invention is illustrated schematically in FIG. 1. The coating process is carried out inside a high vacuum chamber 1, which is fabricated according to techniques known in the art. Vacuum chamber 1 is evacuated into the high vacuum region by first pumping with a rough vacuum pump (not shown) and then by a high vacuum pump, 2. Pump 2 can be a diffusion pump, turbomolecular pump, cryogenic pump ("cryopump"), or other high vacuum pumps known in the art. Use of a diffusion pump with a cryogenically cooled coil for pumping water vapor is a preferred high vacuum pumping arrangement for the present invention. The use of cryopumps with carbon adsorbents is somewhat less advantageous than other high vacuum pumps because such cryopumps have a low capacity for hydrogen which is generated by the ion beam sources used in the method of the present invention. The low capacity for hydrogen results in the need to frequently regenerate the adsorbent in the cryopumps.

It is understood that the process of the present invention can be carried out in a batch-type vacuum deposition system, in which the main vacuum chamber is evacuated and vented to atmosphere after processing each batch of parts; a load-locked deposition system, in which the main vacuum deposition chamber is maintained under vacuum at all times, but batches of parts to be coated are shuttled in and out of the deposition zone through vacuum-to-air load locks; or inline processing vacuum deposition chambers, in which parts are flowed constantly from atmosphere, through differential pumping zones, into the deposition chamber, back through differential pumping zones, and returned to atmospheric pressure.

Substrates to be coated are mounted on substrate holder 3, which may incorporate tilt, simple rotation, planetary motion, or combinations thereof. For coating lenses, domed planetary substrate holders may be used. The substrate holder can be in the vertical or horizontal orientation, or at any angle in between. Vertical orientation is preferred to minimize particulate contamination of the substrates, but if special precautions such as low turbulence vacuum pumping and careful chamber maintenance are practiced, the substrates can be mounted in the horizontal position and held in place by gravity. This horizontal mounting is advantageous from the point of view of easy fixturing of small substrates which are not easily clamped in place. This horizontal geometry can be most easily visualized by rotating the illustration in FIG. 1 by 90 degrees.

Prior to deposition, the substrates are ion beam sputter-etched with an energetic ion beam generated by ion beam source 4. Ion beam source 4 can be any ion source known in the prior art, including Kaufman-type direct current discharge ion sources, radio frequency or microwave frequency plasma discharge ion sources, microwave electron cyclotron resonance ion sources, each having one, two, or three grids, or gridless ion sources such as the Hall Accelerator and End Hall ion source of U.S. Pat. No. 4,862,032; the description of which is incorporated by reference herein. The ion source beam is charge neutralized by introduction of electrons into the beam using a neutralizer (not shown), which may be a thermionic filament, plasma bridge, hollow cathode, or other types known in the prior art.

Ion source 4 is provided with inlets 5 and 6 for introduction of gases directly into the ion source plasma chamber within ion source 4. Inlet 5 is used for introduction of inert gases, such as argon, krypton, and xenon, for the sputter-etching. Additionally, during the sputter-etching step, oxygen may be introduced in inlet 6, and used independently or mixed with an inert gas to provide chemically-assisted sputter-etching, e.g. for plastic substrates. Inlet 6 is used for introduction of reactive gases such as hydrocarbons (e.g. methane, acetylene, cyclohexane), siloxanes, silazanes, oxygen, nitrogen, hydrogen, ammonia, and similar gases for the coating deposition. During the coating deposition, the reactive gases can be mixed with an inert gas to modify the properties of the resultant coating and improve the stability of the ion source. The reactive gases can also be introduced away from the ion source plasma chamber, but into the ion beam by inlet 7. Inlet 7 may contain multiple holes for the introduction of reactive gases, or may be a "gas distribution ring". Finally, reactive gases for the deposition, e.g. oxygen and ammonia, can be introduced at or near the substrate by inlet 8, or into the chamber background by inlet 9. The reactive gases introduced by inlet 8 modify the properties of the coating by chemical reaction at the surface of the coating during deposition.

Additionally, to improve the deposition rate and throughput of the coating machine, multiple ion sources 4 can be utilized and operated simultaneously. Operation of the ion sources can be sequenced for the case in which different coating materials are deposited from each ion source. As described in U.S. Pat. No. 4,490,229, an additional ion source (not shown) can be used to co-bombard the substrates during coating deposition to alter the film properties.

According to the method of the present invention, the substrate is first chemically cleaned to remove contaminants, such as residual hydrocarbons and other contaminants, from the substrate manufacturing and handling processes. Ultrasonic cleaning in solvents, or other aqueous detergents as known in the art is effective. Details of the cleaning procedure depend upon the nature of the contamination and residue remaining on the part after manufacture and subsequent handling. It has been found that it is critical for this chemical cleaning step to be effective in removing surface contaminants and residues, or the resulting adhesion of the coating will be poor.

In the second step of the process, the substrate is inserted into a vacuum chamber, and the air in said chamber is evacuated. Typically, the vacuum chamber is evacuated to a pressure of $1\times10^{-5}$ Torr or less to ensure removal of water vapor and other contaminants from the vacuum system. However, the required level of vacuum which must be attained prior to initiating the next step must be determined by experimentation. The exact level of vacuum is dependent upon the nature of the substrate material, the sputter-etching rate, the constituents present in the vacuum chamber residual gas, and the details of the coating process. It is not desirable to evacuate to lower pressures than necessary, as this slows down the process and reduces the throughput of the coating system.

In the third step of the process, the substrate surface is bombarded with a beam of energetic ions from an ion beam to assist in the removal of residual contaminants, e.g. any residual hydrocarbons, surface oxides and other contaminants, not removed in the first step, and to activate the surface. By the term "ion beam", it is intended to mean a beam of ions generated from a plasma which is remote from the substrate. The ions can be extracted from the plasma by a variety of techniques which include, but are not limited to the use of electrostatic grids which are biased to promote extraction of positive ions, e.g. Kaufman-type ion source, or magnetic fields coupled with electrostatic fields, e.g. End Hall-type ion source and Hall accelerators. After extraction, the ions are directed from the ion source toward the substrates due to the potential difference between the source of the ions (plasma) and the samples, typically at or near ground potential. The ion beam is typically charge neutralized with electrons obtained from a variety of possible sources including but not limited to a thermionic hot filament, a plasma bridge neutralizer or a hollow cathode. Charge neutralization of the ion beam allows the processing of electrically insulating substrates in a very stable fashion since the potential of the substrate is maintained. Typical pressures in the deposition zone around the substrate for the invention are in the range of about $10^{-6}$ Torr to about $5\times10^{-3}$ Torr so that ion-gas collisions can be minimized, thereby maintaining the high energy ion bombardment of the surface which is necessary for the formation of dense, hard coatings. This sputter-etching of the substrate surface is required to achieve high adhesion between the substrate surface and the coating layer(s). The sputter-etching can be carried out with inert gases such as argon, krypton, and xenon. Additionally, hydrogen or oxygen may be added to the ion beam to assist in activation of the surface. The sputter-etching source gas can be introduced in a variety of different ways, including direct introduction into the plasma chamber of the ion source, introduction near the ion source but not directly into the source, i.e. through inlet 7, or introduction into a location remote from the source, as the vacuum chamber background gas through inlet 9. Typically, in order to achieve efficient and rapid ion sputter-etching, the ion beam energy is greater than 20 eV. Ion energies as high as 2000 eV can be used, but ion beam energies less than 500 eV result in the least amount of atomic scale damage to the substrate.

Immediately after the substrate surface has been sputter-etched, a coating layer is deposited on the substrate by a beam of ions containing two or more of the elements of C, Si, H, O, N or subgroups of these elements. This ion beam is generated by introducing precursor gases containing two or more of the elements of C, Si, H, O, N or subgroups of these elements into the ion source plasma, near the ion source plasma, or remote from the ion source plasma. These precursor gases may be blended with other inert gases, e.g. argon. The precursor gases undergo "activation" in the ion source plasma or in the ion beam itself. Examples of "activation" include, but are not limited to simple electronic excitation, ionization, chemical reaction with other species, ions and neutrals, which may be electronically excited, and decomposition into simpler ionic or neutral species which may be electronically excited. Ions are extracted from the remote plasma to form an ion beam which is charge neutralized by addition of electrons. Some of these activated precursor species then condense on the surface of the substrate to be coated. The ions strike the surface with energies from 10 to 1500 eV. The ion impact energy depends on the electric field between the point of origin of the ion and the sample, and the loss of energy due to collisions which occur between the ion and other ionic or neutral species prior to the impingement of the ion onto the substrate. The neutrals will strike the surface with a variety of energies, from thermal to 100's of eV, depending on the origin of the neutral. This highly energetic deposition process produces highly adherent, very dense and hard coatings on the substrate surface. The density, hardness and other properties of the coating are all very dependent on the energetics of the deposition process as well as the precursor gases used.

The following describes several different forms of the ion beam deposited, abrasion-resistant coating. In the simplest case, the deposition process conditions are not changed during the coating process, resulting in a single layer coating. The thickness of this layer can be from about 50 Å to about 100 microns, depending on the degree of abrasion protection required by the application. Generally, thicker coatings provide greater wear and abrasion-resistance.

In the second case, it is desirable to provide multiple coating layers on a substrate. One example of this situation is the case of a plastic ophthalmic lens with an anti-reflective coating. For this case, a thick, transparent coating is first deposited to provide abrasion resistance. Using the process of the present invention, materials with different indices of retraction are made simply by varying the deposition conditions such as precursor gas composition or ion beam energy. By alternating layers of precise thicknesses and sufficiently different refractive indices on top of the thick layer, an anti-reflective coating is created. The range of suitable layer thicknesses and refractive indices are well known in the prior art. In this way, a highly abrasion-resistant, anti-reflective plastic lens product is created. Using the same type of layering of materials with different indices one can design specific reflective colors, e.g. quarter-wave stacks, using techniques that are well known in the prior art.

The third case is applicable in situations where the hard, abrasion-resistant, or low-friction layer does not adhere well to the substrate. In this situation, it is desirable to use a first adhesion-promoting layer or interlayer. Such a layer may utilize different precursor gases or different deposition conditions in order to enhance chemical bonding of the abrasion-resistant, or low-friction layer to the substrate, or to reduce film stress to enhance adhesion to the substrate. Therefore, the first layer must adhere well to the substrate and the subsequent, abrasion-resistant layer must adhere well to the first layer. For this situation, a thin (less than 1 micron) adhesion promoting layer is typically used with a thick (about 2 to about 100 microns) abrasion-resistant outer layer on top.

There are other cases in which a thick, abrasion-resistant layer may adhere well to the substrate but is lacking in some other property, such as low friction, so that one or more additional top coatings are required. An example of this situation is discussed in Kimock et al., U.S. Pat. No. 5,268,217, for coated wear resistant glass bar-code scanner windows. For this product, a thick, hard, silicon oxy-nitride coating layer material which is abrasion-resistant under most conditions is used. When a piece of glass is rubbed over the silicon oxy-nitride layer, glass debris is left on the surface of the coating due to the high friction between glass and silicon oxy-nitride. If a thin layer of low-friction DLC or other low-friction material is deposited over the silicon-oxy-nitride, rubbing with glass does not leave debris on the surface. The present invention can be used to deposit an adhesion layer, a thick, abrasion-resistant layer, e.g. silicon oxy-nitride, and the low-friction, DLC top layer. Additionally, the DLC could be deposited by other known methods. Finally, other low-friction top layers such as boron nitride, tin oxide, indium tin oxide, aluminum oxide, and zirconium oxide can be used.

DLC is an outstanding abrasion-resistant material. Therefore, for cases where an extremely hard, inert, abrasion-resistant coating is required, DLC is a preferred coating. It has been found that deposition of interlayer materials which contain silicon atoms onto the substrate prior to deposition of the DLC layer results in highly adherent DLC coatings with outstanding wear resistance properties. It is currently believed that reaction between silicon atoms in the interlayer material and the carbon atoms in the DLC layer is critical for the DLC coating to exhibit excellent adhesion. Direct ion beam deposition of interlayers containing silicon and one or more of the elements hydrogen, oxygen, carbon, and nitrogen can be performed by the present invention by operating ion source 4 on gases which contain these elements. For example, ion source 4 can be operated on diethylsilane gas to produce an interlayer containing silicon, carbon, and hydrogen. The thickness of these interlayers is typically in the range of about 10 Å to 1 micron in thickness.

The silicon-containing layers of the present invention, previously referred to, contain the following combinations of elements: Si and C; Si, C and H; Si and N; Si, N and H; Si and O; Si, O and H; Si, O and N; Si, O, N and H; Si, C, H and N; Si, C, H and O; Si, C and N; Si, C and O; Si, O, C and N; and Si, C, H, O and N, may be referred by the names of amorphous silicon carbide, silicon nitride, silicon oxide, and silicon oxy-nitride, and mixtures thereof and chemical combinations thereof, such as "silicon carbonitride", "silicon oxy-carbide", and "silicon oxy-carbonitride". By "silicon carbide", it is meant to include materials which are composed of the elements silicon and carbon, and possibly hydrogen. Stoichiometric and non-stoichiometric amounts of silicon and carbon are included in the definition of this silicon carbide material. By "silicon nitride", it is meant to include materials which are composed of the elements silicon and nitrogen, and possibly hydrogen. Stoichiometric and non-stoichiometric amounts of silicon and nitrogen are included in the definition of this silicon nitride material. By "silicon oxide", it is meant to include materials which are composed of the elements silicon and oxygen, and possibly hydrogen. By "silicon oxy-nitride", it is meant to include materials which are composed of the elements silicon, oxygen, and nitrogen, and possibly hydrogen. Materials falling under the chemical formula $SiO_xN_yH_z$ are considered to be within the definition of this silicon oxy-nitride material. The amorphous silicon oxy-carbide (Si, O, C, H) and silicon oxy-carbonitride (Si, O, C, N, and H) materials deposited by the process of the present invention are particularly advantageous as abrasion-resistant coatings for plastic substrates.

It is advantageous to deposit the DLC layer immediately following the deposition of the adhesion promoting layer to minimize the possibility of recontamination of the interlayer surface with vacuum chamber residual gases or other contaminants. The thickness of the ion beam deposited DLC coating can be between 50 Å and approximately 100 microns. Thinner DLC coatings, on the order of 50 Å are useful when the main function of the DLC is to provide a low friction surface, or chemical protection. Thicker DLC layers are useful when the protection from severe abrasion is required.

Several ion beam deposition methods may be used for the formation of the DLC coatings of the present invention, including direct ion beam deposition, and direct ion beam deposition with ion assist as in U.S. Pat. No. 4,490,229, referred to above.

For sake of process simplicity, rapid deposition, and ease of scale-up to mass production, direct ion beam deposition from a hydrocarbon gas source is the most preferred DLC deposition process for this invention. Methane or cyclohexane are preferred as the hydrocarbon source gases, but other hydrocarbon gases, such as acetylene, butane, and benzene can be used as well. Hydrogen and inert gases, e.g. argon, krypton, and xenon, may be introduced into the ion source plasma to modify the DLC film properties. The ion energy used in the DLC deposition process may be in the range of approximately 20 eV to approximately 1000 eV. Ion energies in the range of 20 eV to 300 eV are most preferred to minimize heating of the substrate during deposition.

Once the chosen thickness of the top coating layer has been achieved, the deposition process on the substrates is terminated, the vacuum chamber pressure is increased to atmospheric pressure, and the coating substrates are removed from the vacuum chamber.

The examples which follow illustrate the superior performance of the method of this invention. The examples are for illustrative purposes only and are not meant to limit the scope of the claims in any way.

EXAMPLE A

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $9.2\times10^{-6}$ Torr. The substrates were sputter-etched for one minute by an argon ion beam generated from an End Hall ion source (manufactured by Commonwealth Scientific as Mark II) operated on 5 sccm of argon, at an anode potential of 171 volts, and an anode current of 1.08 amps. The Ar gas was introduced directly into the plasma chamber of the ion source. The pressure in the chamber was $7.4\times10^{-5}$ Torr. A hot filament was used as the electron source. After sputter-etching methane gas was introduced directly into the plasma chamber of the ion source at a flow of 10 sccm resulting in a pressure of $6.6\times10^{-5}$ Torr. The anode voltage was 172 volts and the anode current was 1.08 amps. After 5 minutes of operation at these conditions, an adherent 2880 Å thick DLC coating was deposited. The compressive stress of the coating was $1.5\times10^{10}$ dynes/cm$^2$. The coating on the fused silica substrate was brown in color when viewed in visible light.

EXAMPLE B

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $2.3\times10^{-6}$ Torr. The substrates were sputter-etched for two minutes by an argon ion beam generated from the End Hall ion source (Commonwealth Scientific's Mark II) operated on 5 sccm of argon, at an anode potential of 170 volts and an anode current of 1.25 amps. The argon gas was introduced directly into the plasma chamber of the ion source. The pressure in the chamber was $4.8\times10^{-5}$ Torr. A hot filament was used as the electron source. After sputter-etching, the argon was shut off and cyclohexane gas was introduced directly into the plasma chamber of the ion source resulting in a chamber pressure of $1.4\times10^{-4}$ Torr. The anode voltage was 26.6 volts and the anode current was 1 amp. Alter 15 minutes of operation at these conditions, a 2650 Å thick DLC coating was obtained. The coating had a compressive stress of $3.6\times10^{9}$ dynes/cm$^2$. The film on the fused silica substrate was yellow in color when viewed in visible light.

EXAMPLE C

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $2.5\times10^{-6}$ Torr. The substrates were sputter-etched for two minutes by an argon ion beam generated from the End Hall ion source (Commonwealth Scientific's Mark II) operated on 6.4 sccm of argon, at an anode potential of 160 volts and an anode current of 0.98 amp. The Ar gas was introduced directly into the plasma chamber of the ion source. The pressure in the chamber was $2.1\times10^{-4}$ Torr. A hot filament was used as the electron source. After the sputter-etching was complete, tetramethylcyclotetrasiloxane was introduced into the plasma chamber of the ion source and the argon was turned off resulting in a chamber pressure of $6.7\times10^{-5}$ Torr. The source was operated at an anode potential of 100 volts at a current of 1.56 amps (ion beam current approximately 0.31 amp). After four minutes of operation at these conditions, the source was shut off and allowed to cool, and the chamber was vented. The coating deposited was adherent and 3775 Å thick, and the compressive stress of the coating was $1.05\times10^{10}$ dynes/cm$^2$. The deposition rate was approximately 945 Å/min. The coating was optically clear to visible light and had a refractive index of 1.8.

EXAMPLE D

A 1"×1" piece of fused silica, a CR-39 lens, 2"×2"×0.125" CR-39 sample, a 2"×2"×0.125" polycarbonate sample, and a piece of Si were all cleaned in isopropyl alcohol and blown dry with nitrogen gas. The samples were mounted onto an 18-inch diameter aluminum plate which was subsequently mounted in a stainless steel vacuum chamber pumped by a 10" diffusion pump and the chamber was evacuated to a pressure of $2.4\times10^{-6}$ Torr. These substrates were sputter-etched for 10 minutes by an argon ion beam generated from the End Hall ion source (Commonwealth Scientific's Mark II) operated on 4.7 sccm of argon gas, at an anode voltage of 150 volts and an anode current of 1.02 amps. The argon gas was introduced directly into the plasma chamber of the ion source. The chamber pressure was $1.1\times10^{-4}$ Torr. After this sputter-etch, the argon flow was increased to 37.5 sccm and the anode voltage was reduced to 50 volts. Hexamethyldisiloxane vapor was introduced into the argon ion beam through a nozzle located approximately 1" downstream of the ion source plasma. The pressure in the chamber was $1.4\times10^{-3}$ Torr. The ion source was then operated at an anode current of 5.10 amps. After 30 minutes of deposition at this condition, an adherent coating of 2500 Å thickness was obtained. In visible light, the coating appeared yellow in color on the fused silica substrate.

EXAMPLE E

A 1"×1" piece of fused silica, a CR-39 lens, a 2"×2"×0.125" CR-39 sample, a 2"×2"×0.125" polycarbonate sample, and a piece of Si were all cleaned in isopropyl alcohol and blown dry with nitrogen gas. The samples were mounted onto an 18" diameter aluminum plate which was subsequently mounted in a stainless steel vacuum chamber which was pumped by a 10" diameter diffusion pump and the chamber was evacuated to a pressure of $2\times10^{-5}$ Torr. The substrates were sputter-etched for 5 minutes by an argon ion beam generated from the End Hall ion source (Commonwealth Scientific's Mark II) operated on 14 sccm of argon gas (introduced directly into the plasma chamber of the ion source), at an anode voltage of 115 volts and an anode current of 3.56 amps. The pressure in the chamber was $2.5\times10^{-4}$ Torr. The electron source was a hollow cathode operated on 3 sccm of argon gas. After this sputter-etch, the argon flow was decreased to 7 sccm and the anode voltage was reduced to 67 volts and hexamethyldisilazane was introduced into the argon ion beam through a nozzle approximately 1" downstream of the ion source. The ion source was operated at 5.1 amps current, and the deposition was continued for 30 minutes. The chamber pressure was $1.1\times10^{-3}$ Torr. An adherent, 2.1-micron thick film was obtained which was very transparent and water-clear when viewed in visible light.

EXAMPLE F

A 1"×1" piece of fused silica and a 3" diameter Si(001) wafer were cleaned in isopropyl alcohol and blown dry with nitrogen gas. The samples were mounted onto a 6" diameter graphite plate which was subsequently mounted in a stainless steel vacuum chamber, and the vacuum chamber was evacuated to a pressure of $1.3\times10^{-5}$ Torr using a 10" diffusion pump. The samples were sputter-etched for 30 seconds with a 500 eV, 137 mAmp argon ion beam generated in Kaufman-type ion source with 11 cm diameter grids. After sputter-etching the substrates, tetraethoxysilane was introduced into the ion source after the argon was turned off. The ion source was operated for 10 minutes at an anode potential of 500 volts and a beam current of 62 mAmps. An adherent coating of 2300 Å thickness was deposited. The compressive stress of the coating was $6.1\times10^{9}$ dynes/cm$^2$. The coating appeared yellow is visible light.

EXAMPLE G

Two 2"×2"×0.125" CR-39 flat substrates, a CR-39 lens, a 2"×2"×0.125" polycarbonate substrate and a 3" diameter Si(001) wafer were ultrasonically cleaned in isopropanol followed by drying with nitrogen gas. The samples were mounted on an 18" diameter aluminum plate with Kapton tape and the plate was mounted in a stainless steel vacuum chamber which was subsequently evacuated to a pressure of $4.4\times10^{-5}$ Torr by a 10" diameter diffusion pump. The samples were sputter etched for 5 minutes with an argon ion beam generated in the End Hall ion source (used in the above examples) using 10 sccm argon gas introduced directly into the plasma chamber of the ion source. The anode potential was 30 volts while the current was 5.8 amps. The electron source for the End Hall ion source was a hollow cathode operated on 3 sccm argon gas. After sputter-etching the substrates, approximately 16 sccm of octamethylcyclotetrasiloxane was introduced into the argon beam through nozzles located approximately 1" downstream of the ion source. The anode potential was 58 volts while the anode current was 5.8 amps. After operating for 3.5 minutes with these conditions, 10 sccm of oxygen gas were introduced. After operating for an additional 30 seconds, the oxygen flow was increased to 30 sccm. After an additional 30 seconds, the oxygen flow was increased to 50 sccm. After an additional 30 seconds, the oxygen flow was increased to 70 sccm and the argon was shut off. The anode potential was 56 volts and the anode current was 5.72 amps. The chamber pressure was $1.45\times10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 5.5 microns of coating was deposited onto the samples.

The stress of the coating was $7.7\times10^{8}$ dynes/cm$^2$. The haze measured on the CR-39 samples was less than 0.4%. The 2"×2"×0.125" piece of coated CR-39 was tested with a Taber abrader using 500 grams load with CS-10F wheels (total of 1 kg load). After 500 cycles, the change in haze was determined to be 0.65%. Glass tested in an identical fashion had a change in haze of 0.69% after 500 cycles. The coating contained silicon, oxygen, carbon and hydrogen (Si, O, C and H).

EXAMPLE H

Two CR-39 lenses, and two CR-39 2"×2"×0.125" pieces were ultrasonically cleaned in isopropanol and then dried using nitrogen gas. The samples were mounted on an 18" diameter aluminum disk with Kapton tape. The disk was mounted into a stainless steel vacuum chamber which was pumped with a 10" diffusion pump. The chamber was evacuated to a pressure of $1.6\times10^{-5}$ Torr. The samples were sputter-etched for 5 minutes using an argon ion beam generated in the End Hall ion source (used in the above examples) with 17.4 sccm of argon gas directly into the plasma chamber of the ion source, an anode potential of 80 volts, and an anode current of 4.22 amps. The electron source for the End Hall ion source was a hollow cathode. A shutter was then placed between the ion source and the substrates to block the ion beam, and 100 sccm of oxygen gas was run into the plasma chamber of the ion source, the argon was turned off, and octamethylcyclotetrasiloxane was allowed into the chamber through nozzles located approximately 1" downstream of the ion source. The anode potential was 72 volts and the anode current was 5.57 amps. The pressure during this process was $1.25\times10^{-3}$ Torr. After 72 minutes of operation at this condition, the ion source plasma and ion beam were extinguished and the chamber was brought to atmospheric pressure, and the substrates were removed. The samples were water-clear in visible light. The coating thickness was 7.6 microns and the compressive stress was $5.7\times10^{8}$ dynes/cm$^2$. The hardness of the coating (measured by nanoindentation) was 3.4 GPa. For reference, the hardness of quartz measured by the same technique was 10 GPa.

EXAMPLE I

Two pieces of Si and six metal alloy substrates were ultrasonically cleaned in trichloroethane followed by isopropanol and then dried with nitrogen gas. The parts were mounted on a 6" diameter graphite plate using Kapton tape. The fixture was mounted into a stainless steel vacuum chamber which was pumped by a 10" diffusion pump. The chamber was evacuated to a pressure of $1.0\times10^{-5}$ Torr. The samples were sputter etched with an argon ion beam generated by a 11 cm Kaufman-type ion source operated with 6 sccm of argon, at an anode potential of 500 volts and a beam current of 137 mAmps for two minutes. The chamber pressure was $1.3\times10^{-4}$ Torr. After sputter-etching, approximately 200 Å layer of Si was deposited by ion beam sputtering from a Si target. A 1000 eV, 0.1 amp ion beam from a 5 cm Kaufman-type ion source was operated on 7 sccm of Ar gas used to sputter the Si target for 1.5 minutes. After deposition of the Si layer, the 11 cm ion source was operated on 12 sccm of methane gas and approximately 12 sccm of diethylsilane gas at an anode potential of 500 volts and a beam current of 0.185 amps for 71 minutes. The chamber pressure was $1.4\times10^{-4}$ Torr. The ion source plasma and ion beam were extinguished and the chamber was brought to atmospheric pressure and the samples were removed. The samples were coated with 2 microns of a coating containing carbon, silicon, and hydrogen. The coating appeared shiny black in visible light and had a nanoindentation hardness of 13 GPa.

EXAMPLE J

Two 2"×2"×0.375" pieces of common float glass are ultrasonically cleaned in isopropanol. The substrates are then mounted onto an aluminum disk with Kapton tape and the disk is mounted into a stainless steel vacuum chamber. The chamber is evacuated to a pressure of $5\times10^{-6}$ Torr. The glass is sputter-etched with an argon ion beam generated in an End Hall ion source operating on argon gas which is introduced directly into the plasma chamber of the ion source. The samples are sputter-etched for two minutes with the anode potential at 50 volts and the anode current at 5 amps. The electron source for the ion beam source is a hollow cathode operating on argon and the chamber pressure is $5\times10^{-4}$ Torr. After sputter-etching, the argon is turned off and 50 sccm of oxygen gas are introduced into the plasma chamber of the ion source. Additionally, 50 sccm of silane are introduced through an nozzle 1" downstream of the ion source. The anode potential is 50 volts and the anode current is 5 amps. These conditions result in deposition of an amorphous $SiO_2$-like film on the substrates. These conditions are maintained for 3 minutes. Then, 50 sccm of ammonia gas are introduced into the plasma chamber of the ion source and the oxygen gas flow is reduced to 5 sccm. The anode potential is 50 volts and the anode current is 5 amps. These conditions produce a silicon-oxy-nitride-like coating material on the substrate. After operation at these conditions for 2 hours, the silane, ammonia, and oxygen gas flows are turned off, and 20 sccm of methane gas is introduced into the plasma chamber of the ion source. The anode potential is 50 volts and the anode current is 5 amps. These conditions produce a DLC coating on the substrate. After operation at these conditions for 2 minutes, the ion source plasma and ion beam are extinguished, the chamber is brought to atmospheric pressure, and the coated glass windows are removed. The total thickness of the coating is 5.5 microns and contains carbon, silicon, hydrogen, oxygen and nitrogen. The samples have a very light brown color when viewed in visible light. The adhesion, abrasion resistance, and chemical resistance of the coating are excellent.

The above Example J process produces a glass substrate with a first layer of amorphous silicon oxide-like material (thickness less than 2,000 Å), a second thick layer of amorphous silicon oxy-nitride material, and a thin (200 Å thick) top layer of DLC.

EXAMPLE K

One glass and one polysiloxane-coated polycarbonate sunglass lens are ultrasonically cleaned in isopropanol and blown dry with nitrogen gas. The lenses are mounted on an aluminum disk with Kapton tape and mounted into a stainless steel vacuum chamber. The chamber is evacuated to a pressure of $5\times10^{-6}$ Torr. The samples are sputter-etched with an argon ion beam generated by the End Hall ion source (used in the above examples) operated on argon introduced directly into the plasma chamber of the ion source with an anode potential of 50 volts and an anode current of 5 amps for 2 minutes. The electron source for the ion beam source is a hollow cathode operated on argon gas. After sputter-etching, the argon is turned off and 50 sccm oxygen are introduced directly into the plasma chamber and 50 sccm of silane are introduced through a nozzle 1" downstream of the ion source. The anode potential is 50 volts and the anode current is 5 amps. These conditions result in deposition of an amorphous silica-like material on the substrate. Alter operation at these conditions for 2 minutes, the silane and oxygen gases are turned off, and 20 sccm of methane gas are introduced directly into the plasma chamber of the ion source. The anode potential is 50 volts and the anode current is 5 amps. These conditions produce a DLC coating on the surface of the substrate. After operation at these conditions for 10 minutes, the ion source plasma and ion beam are extinguished, the chamber is brought to atmospheric pressure, and the lenses are removed. The lenses have a gold-brown reflected color when viewed in visible light. The coating has excellent adhesion, abrasion-resistance, and chemical resistance.

The Example K process described above provides a coated sunglass lens with a 500 Å-thick layer of amorphous silica-like interlayer material and a 1000 Å-thick layer of DLC.

EXAMPLE L

Two 2"×2"×0.125" CR-39 flat substrates, a CR-39 lens, a 2"×2"×0.125" polycarbonate substrate, a 8" diameter× 0.125" thick polycarbonate substrate and a 3" diameter Si(001) wafer were ultrasonically cleaned in isopropanol followed by drying with nitrogen gas. The samples were mounted on 8.5" diameter disks with Kapton tape and the disks were mounted in a stainless steel vacuum chamber on a planetary drive which was subsequently evacuated to a pressure of $5\times10^{-6}$ Torr by a 10" diameter diffusion pump. The samples were sputter etched for 2 minutes with an argon ion beam generated in the End Hall ion source (used in the above examples) using 3 sccm argon gas introduced directly into the plasma chamber of the ion source. The anode potential was 50 volts while the current was 5.6 amps. The electron source for the End Hall ion source was a hollow cathode operated on 3 sccm argon gas. Alter sputter-etching the substrates, approximately 16 sccm of octamethylcyclotetrasiloxane was introduced into the argon beam through nozzles located approximately 1" downstream of the ion source. The anode potential was 59 volts while the anode current was 5.8 amps (ion beam current approximately 1.5 amps). After operating for 3.0 minutes with these conditions, 70 sccm of oxygen gas was introduced into the plasma chamber of the ion source and the argon flow was reduced to 0.0 sccm. The anode potential was 57 volts and the anode current was 5.79 amps (ion beam current approximately 1.5 amps). The chamber pressure was $1.4\times10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 4.8 microns of coating was deposited onto the samples.

The stress of the coating was $6.4\times10^{8}$ dynes/cm$^2$. The tensile strain to microcracking of the coating was determined using a four point bend technique. Coated polycarbonate pieces, 1 cm×10 cm, were cut from the 8" diameter disk and mounted in the four point bend apparatus. The samples were bent until microcracking of the coating was observed. The radius of curvature was measured and the strain was calculated. The results indicate that the tensile strain required to produced microcracking of the coating was 2.1–2.2%.

Examples G, H and L demonstrate that the present invention can produce highly optically transparent, water-clear, low stress, adherent, hard, abrasion-resistant coatings containing silicon, carbon, oxygen, and hydrogen on plastic substrates at high deposition rates. For high rate deposition of these materials, the End Hall source is a preferred ion beam source because of its ability to produce high ion beam currents. Additionally, these high ion beam currents are produced at low ion beam energies, which results in reduced substrate heating and other advantageous properties of the coating.

In a preferred embodiment of the present invention, coatings comprising silicon, oxygen, carbon, and hydrogen, having the properties of Nanoindentation hardness in the range of about 2 to about 5 GPa and a tensile strain to microcracking greater than about 1% are deposited. These coatings comprising silicon, oxygen, carbon, and hydrogen are set forth in detail in the copending application. Ser. No. 08/205,954 on the same date; the details of which are incorporated herein by reference. When applied to plastic substrates, these coatings produced Taber abrasion resistance test results equivalent to that of glass. These coatings are particularly useful in applications where optical plastic substrates require improved abrasion protection (e.g. plastic sunglass or ophthalmic lenses). Example E demonstrated that the invention can produce similar coatings which contain nitrogen.

The properties of the coatings in Examples E, G, H, and L, which make them highly attractive and unique are hardness which is much greater than that of plastics such as polycarbonate and CR-39 (typical hardness 0.2–0.3 GPa), or polymer coatings, and high flexibility and high tensile strain to microcracking. Compositionally, the coatings are not $SiO_2$, but rather contain significant amounts (>5 atomic percent) of carbon and, therefore, do not show brittle fracture failure as is exhibited by glass or quartz coatings.

A unique advantage of the use of the ion beam method for producing these materials is the relationship between stress and hardness. It is well known in the prior art that stress and hardness are often strongly related. Typically, the greater the compressive stress, the harder the material. For the case of the Si—O—C—H materials produced by injecting siloxane precursors into an oxygen ion beam, it was unexpectedly found that by increasing the ratio of oxygen to siloxane precursor, the coating hardness was increased, while the compressive stress was simultaneously decreased. By this method, it is possible to produce hard, abrasion-resistant coatings which are under tensile stress, or are nearly stress-free. This is a very unexpected result for an energetic deposition process, and a key technical advantage of the present invention.

It is believed that the reduction in compressive stress with increasing hardness is due to the etching of carbon from the growing surface by the oxygen ions, or activated oxygen in the ion beam. It has been observed by Energy Dispersive Spectroscopy that the carbon signal in the deposited coatings decreases with increasing oxygen flow rate for a fixed siloxane precursor flow rate. It is believed that the reduction in compressive stress with increasing coating hardness is unique to the ion beam process of the present invention.

Using the process of the present invention, very high deposition rates can be achieved while maintaining low substrate temperature. This invention produces coatings which are very adherent and provide outstanding abrasion protection. For example, coated plastic substrates such as lenses, which have abrasion resistance equal to that of glass can be produced. Because of the high coating deposition rates which can be attained, the invention provides an economical manufacturing process. The process of the present invention is also readily scaled-up to mass production using commercially available equipment.

From the foregoing description, one of ordinary skill in the art can easily ascertain that the present invention provides an improved method for producing highly protective and abrasion-resistant coatings on a variety of substrates, including optical plastics. Highly important technical advantages of the present invention include outstanding adhesion of the ion beam deposited coatings, outstanding abrasion resistance, and ease and flexibility of mass production.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed is:

1. A method for producing an optically transparent coating on the surface of a substrate comprising:

(a) chemically cleaning the surface of said substrate to remove residual hydrocarbons and other contaminants;

(b) mounting said substrate in a deposition vacuum chamber and evacuating the air from said chamber, (c) sputter-etching the surface of said substrate with a beam of ions to further remove residual hydrocarbons and other surface contaminants, and to activate the surface;

(d) plasma ion beam depositing using precursor gases at least one layer of a material selected from the group consisting of an amorphous silicon carbide, silicon nitride, silicon oxide, silicon oxy-nitride, silicon oxy-carbide, silicon carbonitride, and silicon oxy-carbonitride and using a gridless ion source having a plasma chamber therein, wherein a plasma is generated in the plasma chamber and a gas stream containing at least a portion of said precursor gases is introduced outside of the ion source and into the plasma ion beam;

(e) increasing the vacuum chamber pressure to atmospheric pressure; and (f) recovering a coated substrate product with an abrasion resistance greater than or about equal to the abrasion resistance of glass lenses.

2. The method of claim 1 wherein said gridless ion source is selected from the group consisting of an End Hall ion source and a Hall accelerator ion source.

3. The method of claim 1 wherein said substrate comprises a material selected from the group consisting of a plastic, a metal, a glass and a ceramic.

4. The method of claim 2 wherein said substrate comprises a material selected from the group consisting of a plastic, a metal, a glass and a ceramic.

5. The method of claim 1 wherein said substrate is an optically transparent material.

6. The method of claim 2 wherein said substrate is an optically transparent material.

7. The method of claim 1 wherein said substrate is an optically transparent lens.

8. The method of claim 2 wherein said substrate is an optically transparent lens.

9. The method of claim 5 wherein said substrate is a bar code scanner window.

10. The method of claim 6 wherein said substrate is a bar code scanner window.

11. The method of claim 1 wherein said substrate material is silicon or germanium.

12. The method of claim 1 wherein said abrasion-resistant coating includes multiple layers of at least two different refractive indices to reduce reflection.

13. The method of claim 1 wherein said abrasion-resistant coating includes multiple layers of at least two different refractive indices to reduce reflection.

14. The method of claim 7 wherein said abrasion-resistant coating includes multiple layers of at least two different refractive indices to reduce reflection.

15. The method of claim 8 wherein said abrasion-resistant coating includes multiple layers of at least two different refractive indices to reduce reflection.

16. A method for depositing onto a parent substrate an optically transparent coating material consisting of C, H, Si and O which comprises:

(a) chemically cleaning the surface of said substrate to remove residual hydrocarbons and other contaminants;

(b) mounting said substrate in a deposition vacuum chamber and evacuating the air from said chamber;

(c) sputter-etching the surface of said substrate with a beam of ions to further remove residual hydrocarbons and other surface contaminants, and to activate the surface;

(d) plasma ion beam depositing onto the surface of said substrate a layer of said optically transparent coating material by exposing said substrate to precursor gases containing carbon, hydrogen, silicon and oxygen, whereby said precursor gases are activated by said plasma ion beam and said substrate is bombarded by ions during the deposition, using a gridless ion source having a plasma chamber therein, wherein a plasma is generated in the plasma chamber and a gas stream containing at least a portion of said precursor gases is introduced outside of the ion source and into the plasma ion beam;

(e) increasing the vacuum chamber pressure to atmospheric pressure; and (f) recovering a product having an abrasion resistance greater than or about equal to the abrasion resistance of glass lenses and coated with said optically transparent coating material having the properties of a Nanoindentation hardness in the range of about 2 to about 5 Giga Pascals and a tensile strain required to produce microcracking in said material of greater than about 1%.

17. The method of claim 16 wherein said precursor gases also contain nitrogen and said optically transparent coating material also contains nitrogen and has an abrasion resistance greater than or equal to the abrasion resistance of glass lenses.

18. The method of claim 16 wherein a portion of said precursor gases are introduced into the plasma chamber of the ion source, and the remaining portion of said precursor gases are introduced outside of the ion source plasma chamber and into the ion beam.

19. The method of claim 16 wherein said precursor gases contain oxygen.

20. The method of claim 16 wherein said precursor gases comprise materials selected from the group consisting of siloxanes, silanes, silazanes, and mixtures thereof.

21. The method of claim 16 wherein said precursor gases comprise materials selected from the group consisting of hexamethyldisiloxane, tetramethylcyclotetrasiloxane, octamethylcyclotetrasiloxane and mixtures thereof.

22. A method for depositing onto a parent substrate an optically transparent coating material consisting of C, H, Si and O which comprise:

(a) chemically cleaning the surface of said substrate to remove residual hydrocarbons and other contaminants;

(b) mounting said substrate in a deposition vacuum chamber and evacuating the air from said chamber;

(c) sputter-etching the surface of said substrate with a beam of ions to further remove residual hydrocarbons and other surface contaminants, and to activate the surface;

(d) plasma ion beam depositing onto the surface of said substrate an interlayer of said optically transparent coating material having the properties of a Nanoindentation hardness in the range of about 2 to about 5 Giga Pascals and a tensile strain required to produce microcracking in said material of greater than about 1% by exposing said substrate to precursor gases containing carbon, hydrogen, silicon and oxygen, whereby said precursor gases are activated by said plasma ion beam and said substrate is bombarded by ions during the deposition, using a gridless ion source having a plasma chamber therein, wherein a plasma is generated in the plasma chamber and a gas stream containing at least a portion of said precursor gases is introduced outside of the ion source and into the plasma ion beam;

(e) depositing onto said interlayer a layer of abrasion-resistance diamond-like carbon coating material;

(f) increasing the vacuum chamber pressure to atmospheric pressure; and (g) recovering a coated substrate product having an abrasion resistance greater than or about equal to the abrasion resistance of glass lenses.

23. The method of claim 22 wherein said precursor gases also contain nitrogen and said optically transparent coating material also contains nitrogen.

24. The method of claim 22 wherein a portion of said precursor gases are introduced into the plasma chamber of the ion source, and the remaining portion of said precursor gases are introduced outside of the ion source plasma chamber and into the ion beam.

25. The method of claim 22 wherein said substrate comprises a material selected from the group consisting of a plastic, a metal, a glass and a ceramic.

26. The method of claim 22 wherein said precursor gases for said interlayer comprise materials selected from the group consisting of siloxanes, silanes, silazanes, and mixtures thereof.

27. The method of claim 22 wherein said precursor gases for said interlayer comprise materials selected from the group consisting of hexamethyldisiloxane, tetramethylcyclotetrasiloxane, octamethylcyclotetrasiloxane and mixtures thereof.

28. A method of producing an optically transparent coating on the surface of a substrate comprising:

(a) chemically cleaning the surface of said substrate to remove residual hydrocarbons and other contaminants;

(b) mounting said substrate in a deposition vacuum chamber and evacuating the air from said chamber;

(c) sputter-etching the surface of said substrate with a beam of gas ions to further remove residual hydrocarbons and other surface contaminants, and to activate the surface;

(d) plasma ion beam depositing using a precursor gas a layer of coating material using an ion beam generated in a gridless ion source having a hollow cathode electron source wherein oxygen is introduced into a plasma chamber of said plasma ion source and octamethylcyclotetrasiloxane is injected outside the ion source and directly into the plasma ion beam;

(e) increasing the vacuum chamber pressure to atmospheric pressure; and (f) recovering a coated substance product with an abrasion resistance greater than or about equal to the abrasion resistance of glass lenses.

*29. A method for producing a diamond-like carbon (DLC) coating on the surface of a substrate using an End Hall ion source comprising:*

*(a) chemically cleaning the surface of said substrate to remove residual hydrocarbons and other contaminants;*

*(b) mounting said substrate in a deposition vacuum chamber and evacuating the air from said chamber;*

*(c) sputter-etching the surface of said substrate with a beam of energetic gas ions to further remove residual hydrocarbons and other surface contaminants, and to activate the surface;*

*(d) generating a plasma in a plasma chamber of said End Hall ion source and introducing a hydrocarbon precursor gas into said plasma chamber to form a hydrocarbon-containing plasma ion beam;*

*(e) controlling an anode voltage energy of said End Hall ion source and plasma ion beam depositing onto said substrate the DLC coating using said plasma ion beam formed in said End Hall ion source;*

*(f) increasing the vacuum chamber pressure to atmospheric pressure; and*

*(g) recovering the DLC coated substrate.*

*30. The method of claim 29 wherein said substrate is a plastic material.*

*31. The method of claim 29 wherein said substrate is silicon or germanium.*

*32. The method of claim 29 wherein said precursor gas for said DLC coating is methane.*

*33. The method of claim 29 wherein said precursor gas for said DLC coating is cyclohexane.*

*34. The method of claim 29 wherein a rate of deposition of the DLC coating is at least about 176 Å per minute and wherein said hydrocarbon precursor gas is selected from the group consisting of methane, acetylene, acetylene, butane, benzene and mixtures thereof.*

* * * * *